US012732177B2

(12) United States Patent
Hwang

(10) Patent No.: US 12,732,177 B2
(45) Date of Patent: Sep. 8, 2026

(54) SEMICONDUCTOR SYSTEMS WITH DATA CLOCK APPLIED

(71) Applicant: SK hynix Inc., Icheon-si (KR)

(72) Inventor: Kyu Dong Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 320 days.

(21) Appl. No.: 18/458,415

(22) Filed: Aug. 30, 2023

(65) Prior Publication Data

US 2024/0250674 A1 Jul. 25, 2024

(30) Foreign Application Priority Data

Jan. 19, 2023 (KR) ........................ 10-2023-0007890

(51) Int. Cl.
*H03K 5/156* (2006.01)
*G11C 7/10* (2006.01)
*G11C 7/22* (2006.01)

(52) U.S. Cl.
CPC ........... *H03K 5/1565* (2013.01); *G11C 7/109* (2013.01); *G11C 7/222* (2013.01)

(58) Field of Classification Search
None
See application file for complete search history.

(56) References Cited

U.S. PATENT DOCUMENTS 9,203,604 B1 * 12/2015 Mendel ................. H04L 7/0337
10,715,127 B2 * 7/2020 Gans ................ G11C 29/50012
10,848,162 B2 * 11/2020 Kim ....................... H03K 5/135
11,404,104 B2 * 8/2022 Kim .................... G11C 11/4096
2004/0201939 A1 10/2004 Shipton et al.
2007/0216462 A1 9/2007 Ishimi

FOREIGN PATENT DOCUMENTS

KR 1020180124395 A 11/2018
KR 1020190129500 A 11/2019

* cited by examiner

*Primary Examiner* — Cassandra F Cox
(74) *Attorney, Agent, or Firm* — WILLIAM PARK AND ASSOCIATES LTD.

(57) ABSTRACT

A semiconductor system includes a controller, configured to: adjust a duty ratio of a data clock according to a system rate in a half rate section, generate a transmission data clock and, transmit the transmission data clock through a channel. The system also includes a semiconductor device configured to receive the transmission data clock through the channel as a reception data clock, and generate an internal data clock for a data input and output operation, based on the reception data clock.

27 Claims, 13 Drawing Sheets

1
11
111
WCK
WCKB
HR
SR_IF
DUTY ADJ
TWCK
TWCKB
12
CH
13
RWCK
RWCKB
131
WCK BUF
IWCK
IWCKB
133
I/O CTR

RWCK
50%
X1

RWCK
(50+α)%
X2
HALF RATE
FULL RATE

SEMICONDUCTOR SYSTEMS WITH DATA CLOCK APPLIED

CROSS-REFERENCE TO RELATED APPLICATIONS

The present application claims priority under 35 U.S.C. 119(a) to Korean Patent Application No. 10-2023-0007890, filed on Jan. 19, 2023, which is incorporated herein by reference in its entirety.

BACKGROUND

1. Technical Field

Embodiments of the present disclosure relate to semiconductor systems with a data clock applied.

2. Related Art

A semiconductor system may perform a data input and output operation comprising a read operation and a write operation using a data clock whose frequency is set higher than that of a system clock. The semiconductor system may reduce power consumption by reducing the frequency of the system clock, while improving the rate of the data input and output operation according to the data clock whose frequency is set high. When the data clock is transmitted in the semiconductor system, the data clock may be attenuated due to inter-symbol interference (ISI).

According to the LPDDR5 (Low Power DDR5) specification, a half-speed section is defined in which a controller creates a data clock with a frequency set at half-speed, which is half the full speed (of a full-speed section) and applies it to a semiconductor device to reduce ISI when the data clock starts to toggle. As used herein, the term, "half-rate section" is synonymous with—half-speed section—. "Full-rate section" is synonymous with—full-speed section—.

SUMMARY

The present disclosure may provide a semiconductor system including a controller configured to: adjust a duty ratio of a data clock according to a system rate in a half rate section, generate a transmission data clock and transmit the transmission data clock through a channel. The system may also provide a semiconductor device configured to receive the transmission data clock through the channel as a reception data clock and, generate an internal data clock for a data input and output operation, based on the reception data clock.

In addition, the present disclosure may provide a semiconductor system including a controller configured to adjust a duty ratio of a data clock according to a duty adjustment signal in a half rate section to generate a transmission data clock, transmit the transmission data clock through a channel, and a semiconductor device configured to receive the transmission data clock through the channel as a reception data clock, generate an internal data clock for a data input and output operation, based on the reception data clock, generate the duty adjustment signal, based on the reception data clock.

In addition, the present disclosure may provide a semiconductor system including a controller configured to generate a data clock for controlling a data input and output operation to output the data clock through a channel. The controller may be configured to generate the data clock having a first frequency and a first duty ratio for a first section, and generate the data clock having a second frequency and a second duty ratio for a second section after the first section. The first frequency and the second frequency may be set to be different. The first duty ratio and the second duty ratio may also be set to be different.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" maymean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Figure 1:
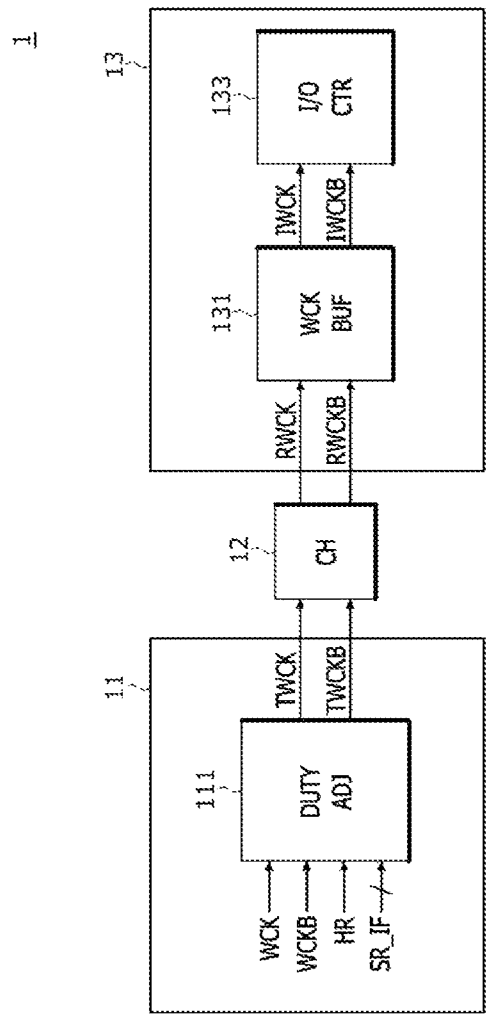
FIG. 1 is a block diagram illustrating a configuration of a semiconductor system according to an embodiment of the present disclosure.

Various embodiments of the present disclosure will be described hereinafter in more detail with reference to the accompanying drawings. However, the embodiments described herein are for illustrative purposes only and are not intended to limit the scope of the present disclosure. FIG. 1 is a block diagram illustrating a configuration of a semiconductor system 1 according to an embodiment of the present disclosure. As shown in FIG. 1, the semiconductor system 1 may include a controller 11, a channel (CH) 12, and a semiconductor device 13. The controller 11 comprises a half-speed section, which creates a data clock with a frequency set at half-speed, which is half the full speed clock and applies the half-speed clock to a semiconductor device to reduce ISI when a data clock starts to toggle. The controller 11 may adjust a duty ratio of a data clock WCK and an inverted data clock WCKB, in a half rate section of the controller 11 according to a system rate, to generate a transmission data clock TWCK and an inverted transmission data clock TWCKB. The controller 11 may transmit the transmission data clock TWCK and the inverted transmission data clock TWCKB through the channel 12. The data clock WCK and the inverted data clock WCKB may be set in phases opposite to each other, and the transmission data clock TWCK and the inverted transmission data clock TWCKB may be set in phases opposite to each other. A reception data clock RWCK and an inverted reception data clock RWCKB may be defined as signals generated as a result of the transmission data clock TWCK and the inverted transmission data clock TWCKB passing through the channel 12. When passing through the channel 12, the transmission data clock TWCK and the inverted transmission data clock TWCKB may be attenuated according to the impedance of the channel 12 as well as inter-signal interference to be generated as the reception data clock RWCK and the inverted reception data clock RWCKB. The reception data clock RWCK and the inverted reception data clock RWCKB may be set in phases opposite to each other. The semiconductor device 13 may buffer the reception data clock RWCK and the inverted reception data clock RWCKB received through the channel 12 to generate an internal data clock IWCK and an inverted internal data clock IWCKB for a data input and output operation. The internal data clock IWCK and the inverted internal data clock IWCKB may be set in phases opposite to each other.

The controller 11, which may be embodied as combination and sequential logic devices as well as an appropriately programmed processor, may include a duty adjustment circuit (DUTY ADJ) 111. The duty adjustment circuit 111 may generate the transmission data clock TWCK and the inverted transmission data clock TWCKB, based on a section setting signal HR, system rate information SR_IF, the data clock WCK, and the inverted data clock WCKB. When a data input and output (I/O) operation consisting of a read operation and a write operation is performed and the data clock WCK and the inverted data clock WCKB are generated, the section setting signal HR may be activated when the half rate section is set before entering the full rate section. The half rate section may be set to reduce attenuation due to inter-signal interference by changing the frequencies of the data clock WCK and the inverted data clock WCKB in stages. When the data I/O operation is performed, the frequency of the data clock WCK and the inverted data clock WCKB may be set to correspond to ½ of the data I/O rate in the half rate section, and then may be set to correspond to the data I/O rate in the full rate section. The data clock WCK and the inverted data clock WCKB may be generated based on a system clock (CK in FIG. 2) and an inverted system clock (CKB in FIG. 2). Each of the system clock CK and the inverted system clock CKB may be set in phases opposite to each other. Each of the system clock CK and the inverted system clock CKB may be set to have a frequency corresponding to the system rate, and each of the data clock WCK and the inverted data clock WCKB may be set to have a frequency corresponding to a data input and output rate that is set to be faster than the system rate. Depending on embodiments, the data input and output rate may be set to be 2 or 4 times faster than the system rate. The system rate information SR_IF may include a plurality of bits having a logic bit set corresponding to the system rate. For example, the system rate information SR_IF may be set to have a first logic bit set at a first system rate, and may be set to have a second logic bit set at a second system rate. The duty adjustment circuit 111 may output the data clock WCK and the inverted data clock WCKB set to have a frequency corresponding to the data input and output rate as the transmission data clock TWCK and the inverted transmission data clock TWCKB when the section setting signal HR is disabled. More specifically, in a state where the half rate section is not set, the duty adjustment circuit 111 may output the data clock WCK set to have the frequency corresponding to the data input and output rate as the transmission data clock TWCK, and may output the inverted data clock WCKB set to have the frequency corresponding to the data input and output rate as the inverted transmission data clock TWCKB. When the half rate section is set and the section setting signal HR is enabled, the duty adjustment circuit 111 may output the data clock WCK and the inverted data clock WCKB set to have a frequency corresponding to ½ of the data I/O rate in the half rate section and set to have a frequency corresponding to the data I/O rate in the full rate section as the transmission data clock TWCK and the inverted transmission data clock TWCKB. In addition, when the half rate section is set and the section setting signal HR is enabled, the duty adjustment circuit 111 may generate the transmission data clock TWCK and the inverted transmission data clock TWCKB whose duty ratios are adjusted according to the system rate, based on the system rate information SR_IF in the half rate section. As an example, when the section setting signal HR is enabled and the system rate information SR_IF set to have a first logic bit set is received at a first system rate, the duty adjustment circuit 111 may generate the transmission data clock TWCK and the inverted transmission data clock TWCKB each adjusted to have a duty ratio of 50% in the half rate section. As another example, when the section setting signal HR is enabled and the system rate information SR_IF set to have a second logic bit set is received at a second system rate, the duty adjustment circuit 111 may generate the transmission data clock TWCK and the inverted transmission data clock TWCKB each adjusted to have a duty ratio of (50+α)% in the half rate section. Here, the "α" maymean duty ratio variation. The "α" may be set to a positive or negative number depending on the system rate. The duty adjustment circuit 111 may output the data clock WCK and the inverted data clock WCKB as the transmission data clock TWCK and the inverted transmission data clock TWCKB in the full rate section entered after the half rate section ends.

The semiconductor device 13 may include a data clock buffer (WCK BUF) 131 and an input and output control circuit (I/O CTR) 133. The data clock buffer 131 may receive the reception data clock RWCK and the inverted reception data clock RWCKB through the channel 12. Because the reception data clock RWCK and the inverted reception data clock RWCKB are signals generated as a result of transmitting the transmission data clock TWCK and the inverted transmission data clock TWCKB through the channel 12, the reception data clock RWCK and the inverted reception data clock RWCKB may be received by the semiconductor device 13 with the duty ratio adjusted according to the system rate in the half rate section. The attenuation of the reception data clock RWCK and the inverted reception data clock RWCKB caused by inter-signal interference may depend on the duty ratio change of the transmission data clock TWCK and the inverted transmission data clock TWCKB adjusted in the half rate section. The data clock buffer 131 may generate the internal data clock IWCK and the inverted internal data clock IWCKB by buffering the reception data clock RWCK and the inverted reception data clock RWCKB.

The input and output control circuit 133 may receive the internal data clock IWCK and the inverted internal data clock IWCKB. The input and output control circuit 133 may perform a data input and output operation, based on the internal data clock IWCK and the inverted internal data clock IWCKB. The input and output control circuit 133 may perform a write operation or a read operation at a data input and output rate corresponding to the frequency of the internal data clock IWCK and the inverted internal data clock IWCKB in the full rate section.

Figure 2:
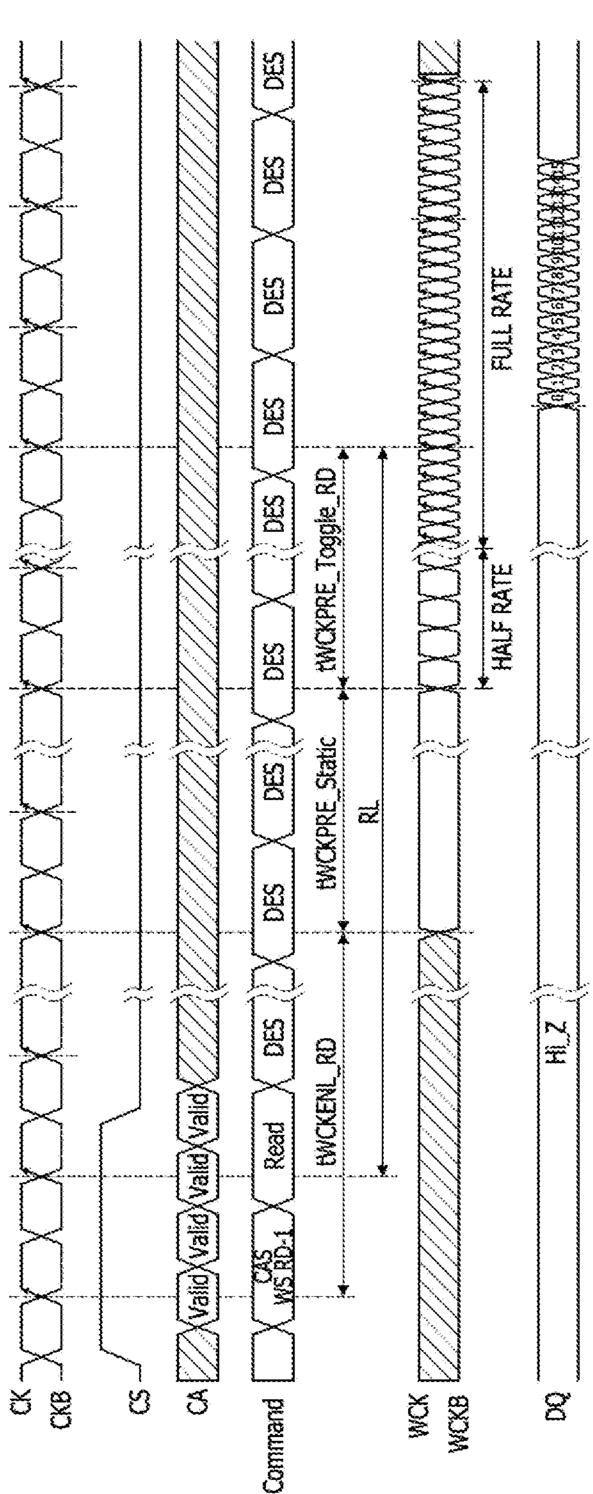
FIG. 2 is a timing diagram illustrating a half rate section according to an embodiment of the present disclosure.

FIG. 2 is a timing diagram illustrating a half rate section's operation according to an embodiment of the present disclosure. A case in which a data clock WCK and an inverted data clock WCKB for a read operation are generated in a state in which a half rate section is set will be described as an example with reference to FIG. 2. First, when a valid external command CA is input in synchronization with a system clock CK and an inverted system clock CKB while a chip selection signal CS is activated, a read command may be generated. Next, in a static section tWCKPRE_Static after a waiting section tWCKENL_RD has elapsed, each of the data clock WCK and the inverted data clock WCKB may be generated to be set to have a preset logic level, and in a toggling section tWCKPRE_Toggle_RD, each of the data clock WCK and the inverted data clock WCKB may be generated to toggle. Because the half rate section HALF RATE is set, the data clock WCK and the inverted data clock WCKB may be generated in a state of toggling with a frequency corresponding to ½ of the data input and output rate in the half rate section, and may be generated in a state of toggling with a frequency corresponding to the data input and output rate in the full rate section. After a read latency RL has elapsed from a point in time when the read command is generated, data may be output through a data pad DQ in synchronization with an internal data clock IWCK and an inverted internal data clock IWCKB generated based on the data clock WCK and the inverted data clock WCKB. In this embodiment, the data I/O rate may be set to be 4 times the system rate, so that the frequency of the data clock WCK and inverted data clock WCKB may be set to be twice the frequency of the system clock CK and inverted system clock CKB in the half rate section and set to be 4 times the frequencies of the system clock CK and inverted system clock CKB in the full rate range, but this is only an example and the present disclosure is not limited thereto. In the present embodiment, the case where the duty ratio of each of the data clock WCK and the inverted data clock WCKB is 50% in the half rate section, is an example. The duty ratio may be adjusted differently according to the system rate in different embodiments.

Figures 3A, 3B, 3C:
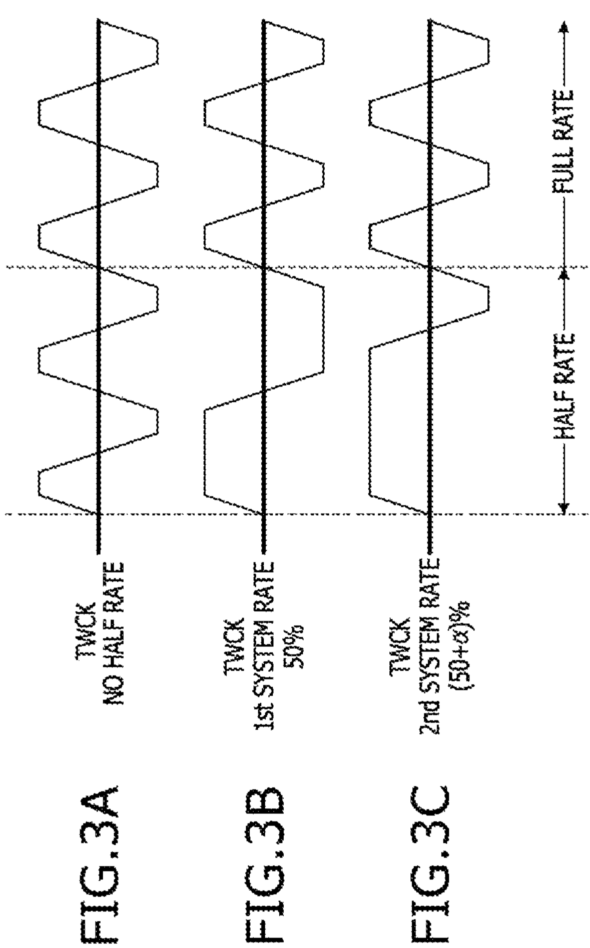
FIGS. 3A, 3B and 3C, are timing diagrams illustrating waveforms of transmission data clocks generated in a semiconductor system.

FIGS. 3A, 3B and 3C are timing diagrams illustrating waveforms of the transmission data clock TWCK generated in the semiconductor system 1 of FIG. 1. As shown in FIG. 3A, the transmission data clock TWCK generated when the half rate section is not set may be generated from a data clock WCK set to have a frequency corresponding to a data input and output rate. As shown in a second waveform of FIG. 3B, the transmission data clock TWCK generated when the half rate section is set and the semiconductor system 1 operates at a first system rate may be generated from a data clock WCK set to have a frequency corresponding to ½ of the data input and output rate in the half rate section, and may be set to have a duty ratio of 50% without changing the duty ratio. As shown in a third waveform of FIG. 3C, the transmission data clock TWCK generated when the half rate section is set and the semiconductor system 1 operates at a second system rate may be generated from the data clock WCK set to have a frequency corresponding to ½ of the data input and output rate in the half rate section, and may be set to have a duty ratio of (50+α)% by adjusting the duty ratio by a duty ratio change set as "α".

Figures 4A, 4B:
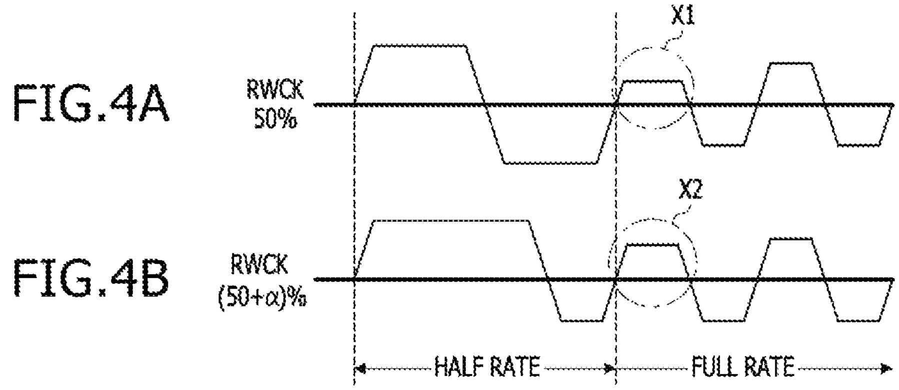
FIGS. 4A and 4B are timing diagrams illustrating waveforms of reception data clocks generated according to a duty ratio change in a semiconductor system.

FIG. 4A and 4B are timing diagrams illustrating waveforms of the reception data clock RWCK generated in the semiconductor system 1 of FIG. 1. As shown in a first waveform of FIG. 4A, when a duty ratio of the reception data clock RWCK is set to 50% in the half rate section, a differential swing level of the reception data clock RWCK, which is generated in the full rate section entered when the half rate section is ended may have a relatively large attenuation, like the attenuation in FIG. 4A identified as X1. As shown in a second waveform of FIG. 4B, when the duty ratio of the reception data clock RWCK is set to (50+α)% in the half rate section, the differential swing level of the reception data clock RWCK, which is generated in the full rate section entered when the half rate section is ended may have a relatively small attenuation, like the attenuation in FIG. 4B identified as X2. When comparing the first and second waveforms shown in FIG. 4A and FIG. 4B, it may be confirmed that attenuation of the reception data clock RWCK is minimized or reduced, when the differential swing level of the reception data clock RWCK before the end of the half rate section is set to be similar to the differential swing level of the reception data clock RWCK in the full rate section according to the duty ratio change α.

Figure 5:
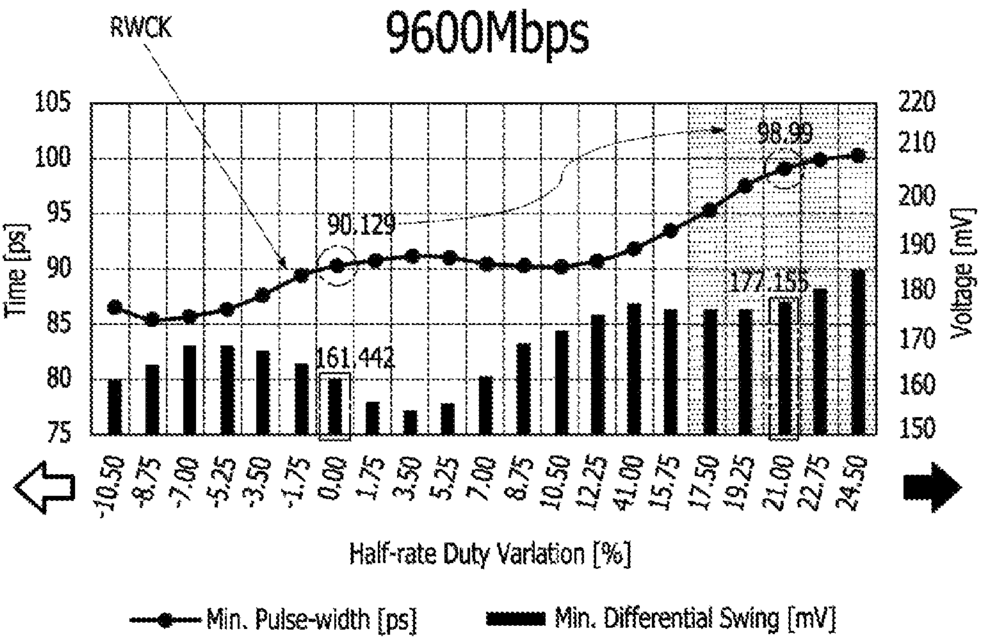
FIGS. 5 and 6 are graphs illustrating waveforms of reception data clocks generated for each system rate in a full rate section in a semiconductor system according to an embodiment of the present disclosure.
Figure 6:
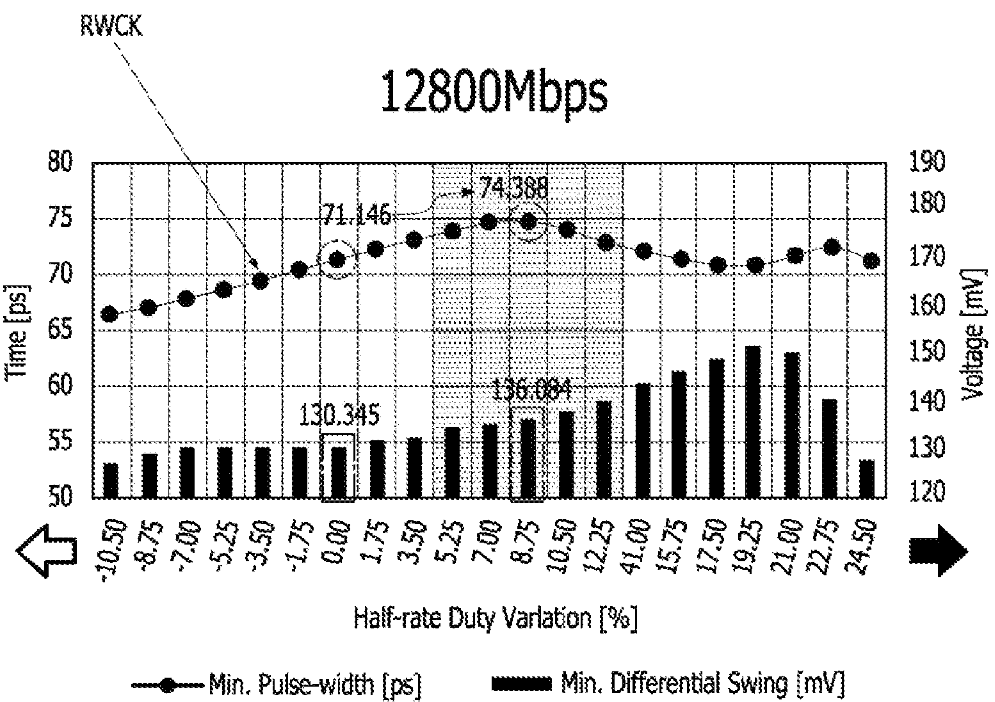

FIGS. 5 and 6 are graphs illustrating waveforms of a reception data clock RWCK generated for each system rate in a full rate section in a semiconductor system according to an embodiment of the present disclosure.

Referring to FIG. 5, when the system rate is 9600 Mbps, the characteristics of the waveform of the reception data clock RWCK generated when the duty ratio sequentially increases by 1.75% from −10.50% to 24.50% can be confirmed. More specifically, when the duty ratio change is set to 0%, a minimum pulse width of the reception data clock RWCK may be set to 90.129 ps and a minimum differential swing level of the reception data clock RWCK may be set to 161.442 mV. In addition, when the duty ratio change is set to 21.00%, the minimum pulse width of the reception data clock RWCK may be set to 98.99 ps and the minimum differential swing level of the reception data clock RWCK may be set to 177.155 mV. The minimum pulse width of the reception data clock RWCK may mean the smallest pulse width among the pulse widths of the pulses included in the reception data clock RWCK generated in the full rate section, and the minimum differential swing level of the reception data clock RWCK may mean the smallest differential swing level among the differential swing levels of the pulses included in the reception data clock RWCK generated in the full rate section. It is confirmed that the minimum pulse width and the minimum differential swing level of the receive data clock RWCK are set to be the largest in the section where the duty ratio change is from 17.50% to 24.50% when the system rate is 9600 Mbps, so that the attenuation of the reception data clock RWCK is minimized. Accordingly, when the system rate is 9600 Mbps, the duty ratio change controlled in the half rate section may be set to 21.00%, which is an average value of the section from 17.50% to 24.50%.

Referring to FIG. 6, when the system rate is 12800 Mbps, the characteristics of the waveform of the reception data clock RWCK generated when the duty ratio sequentially increases by 1.75% from −10.50% to 24.50% can be confirmed. More specifically, when the duty cycle change is set to 0%, the minimum pulse width of the reception data clock RWCK may be set to 71.146 ps and the minimum differential swing level of the reception data clock RWCK may be set to 130.345 mV. In addition, when the duty ratio change is set to 8.75%, the minimum pulse width of the reception data clock RWCK may be set to 74.388 ps and the minimum differential swing level of the reception data clock RWCK may be set to 136.084 mV. It is confirmed that the minimum pulse width and the minimum differential swing level of the reception data clock RWCK are set to be the largest in the range of the duty ratio change is from 5.25% to 12.25% when the system rate is 12800 Mbps, so that the attenuation of the reception data clock RWCK is minimized. Accordingly, when the system rate is 12800 Mbps, the duty ratio change controlled in the half rate section may be set to 8.75%, which is an average value of the section from 5.25% to 12.25%.

Figure 7:
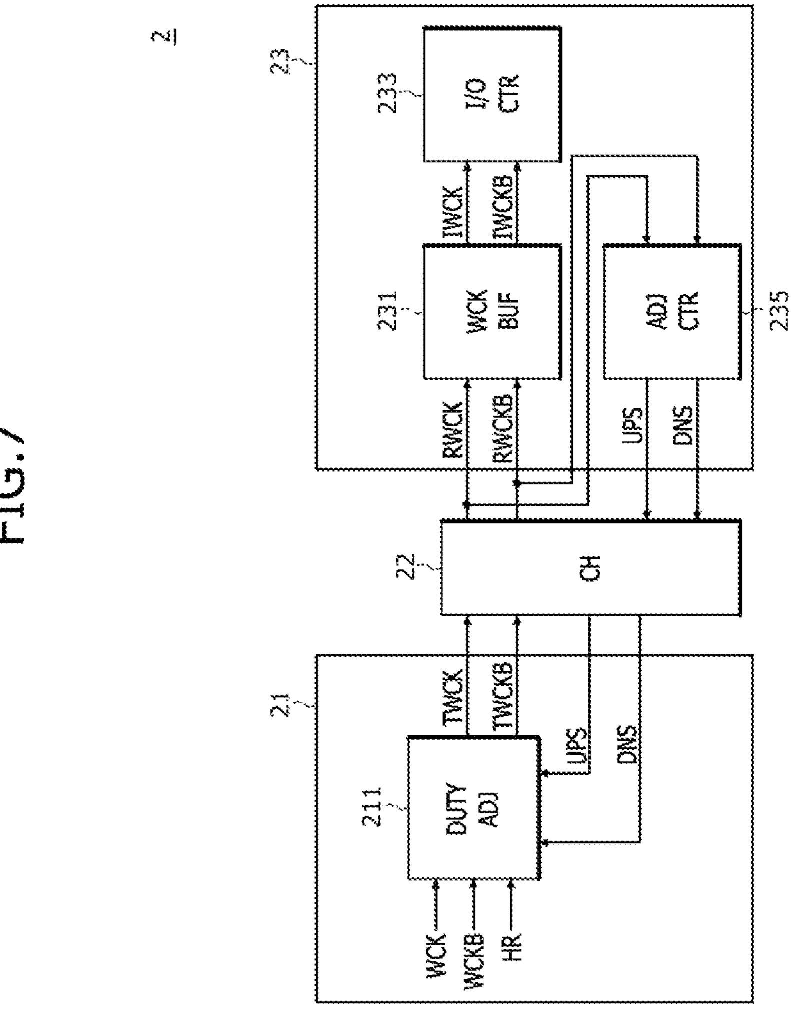
FIG. 7 is a block diagram illustrating a configuration of a semiconductor system according to another embodiment of the present disclosure.

FIG. 7 is a block diagram illustrating a configuration of a semiconductor system 2 according to another embodiment of the present disclosure. As shown in FIG. 7, the semiconductor system 2 may include a controller 21, also with a half-rate section, a channel (CH) 22, and a semiconductor device 23. The controller 21 may adjust a duty ratio of each of a data clock WCK and an inverted data clock WCKB in the half rate section of the controller 21 according to duty adjustment signals UPS and DNS to generate a transmission data clock TWCK and an inverted transmission data clock TWCKB. The controller 21 may transmit the transmission data clock TWCK and the inverted transmission data clock TWCKB through the channel 22. The semiconductor device 23 may buffer a reception data clock RWCK and an inverted reception data clock RWCKB received through the channel 22 to generate an internal data clock IWCK and an inverted internal data clock IWCKB. The semiconductor device 23 may detect the degree of attenuation of the reception data clock RWCK and the inverted reception data clock RWCKB received through the channel 22 in the full rate section to generate the duty adjustment signals UPS and DNS. The semiconductor device 23 may apply the duty adjustment signals UPS and DNS to the controller 21.

The controller 21 may include a duty adjustment circuit (DUTY ADJ) 211. The duty adjustment circuit 211 may generate the transmission data clock TWCK and the inverted transmission data clock TWCKB, based on a section setting signal HR, the duty adjustment signals UPS and DNS, the data clock WCK, and the inverted data clock WCKB. The duty adjustment circuit 211 may output the data clock WCK and the inverted data clock WCKB that are set to have a frequency corresponding to a data input and output rate as the transmission data clock TWCK and the inverted transmission data clock TWCKB when the section setting signal HR is disabled. When the half rate section is set and the section setting signal HR is enabled, the duty adjustment circuit 211 may output the data clock WCK and the inverted data clock WCKB that are set to have a frequency corresponding to ½ of the data I/O rate in the half rate section and set to have a frequency corresponding to the data I/O rate in the full rate section as the transmission data clock TWCK and the inverted transmission data clock TWCKB. In addition, when the half rate section is set and the section setting signal HR is enabled, the duty adjustment circuit 211 may generate the transmission data clock TWCK and the inverted transmission data clock TWCKB whose duty ratio is adjusted based on the duty adjustment signals UPS and DNS in the half rate section. As an example, when the section setting signal HR is enabled and the up adjustment signal UPS of the duty adjustment signals UPS and DNS is activated, the duty adjustment circuit 211 may increase the duty ratio of the transmission data clock TWCK and the inverted transmission data clock TWCKB. Here, the increased duty ratio of the transmission data clock TWCK and the inverted transmission data clock TWCKB may be set in various ways according to embodiments. As another example, when the section setting signal HR is enabled and the down adjustment signal DNS of the duty adjustment signals UPS and DNS is activated, the duty adjustment circuit 211 may reduce the duty ratio of the transmission data clock TWCK and the inverted transmission data clock TWCKB. Here, the reduced duty ratio of the transmission data clock TWCK and the inverted transmission data clock TWCKB may be set in various ways according to embodiments.

The semiconductor device 23 may include a data clock buffer (WCK BUF) 231, an input and output control circuit (I/O CTR) 233, and an adjustment control signal generation circuit (ADJ CTR) 235.

The data clock buffer 231 may receive the reception data clock RWCK and the inverted reception data clock RWCKB through the channel 22. Because the reception data clock RWCK and the inverted reception data clock RWCKB are signals generated as a result of transmitting the transmission data clock TWCK and the inverted transmission data clock TWCKB through the channel 22, the reception data clock RWCK and the inverted reception data clock RWCKB may be received by the semiconductor device 23 with the duty ratio adjusted according to the duty adjustment signals UPS and DNS in the half rate section. The attenuation of the reception data clock RWCK and the inverted reception data clock RWCKB caused by inter-signal interference may depend on the duty ratio change of the transmission data clock TWCK and the inverted transmission data clock TWCKB adjusted in the half rate section. The data clock buffer 231 may generate the internal data clock IWCK and the inverted internal data clock IWCKB by buffering the reception data clock RWCK and the inverted reception data clock RWCKB.

The input and output control circuit 233 may receive the internal data clock IWCK and the inverted internal data clock IWCKB from the data clock buffer 231. The input and output control circuit 233 may perform a data input and output operation, based on the internal data clock IWCK and the inverted internal data clock IWCKB. The input and output control circuit 233 may perform a write operation or a read operation at a data input and output rate corresponding to a frequency of the internal data clock IWCK and the inverted internal data clock IWCKB in the full rate section.

The adjustment control signal generation circuit 235 may receive the reception data clock RWCK and the inverted reception data clock RWCKB through the channel 22. The adjustment control signal generation circuit 235 may detect the degree of attenuation of the reception data clock RWCK and the inverted reception data clock RWCKB to generate the duty adjustment signals UPS and DNS in the full rate section. The adjustment control signal generation circuit 235 may apply the duty adjustment signals UPS and DNS to the controller 21 through the channel 22. In the present embodiment, the adjustment control signal generation circuit 235 may detect the degree of attenuation of the reception data clock RWCK and the inverted reception data clock RWCKB to generate the duty adjustment signals UPS and DNS in the full rate section, but may be implemented to detect the degree of attenuation of the internal data clock IWCK and the inverted internal data clock IWCKB to generate the duty adjustment signals UPS and DNS in the full rate section according to embodiments.

Figure 8:
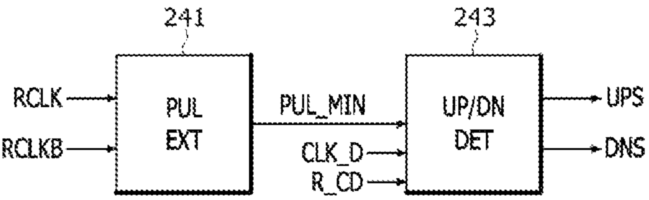
FIG. 8 is a block diagram illustrating a configuration according to an example of an adjustment control signal generation circuit included in a semiconductor system according to another embodiment of the present disclosure.

FIG. 8 is a block diagram illustrating a configuration of an adjustment control signal generation circuit 235A according to an example of the adjustment control signal generation circuit 235 of FIG. 7. As shown in FIG. 8, the adjustment control signal generation circuit 235A may include a pulse extraction circuit (PUL EXT) 241, and an up/down detection circuit (UP/DN DET) 243.

The pulse extraction circuit 241 may extract a pulse having a minimum pulse width and a minimum differential swing level among pulses included in the reception data clock RWCK and the inverted reception data clock RWCKB as a minimum pulse PUL_MIN. As an example, the pulse extraction circuit 241 may select and output the pulse having the minimum pulse width and the minimum differential swing level as the minimum pulse PUL_MIN among the pulses of the reception data clock RWCK generated during a preset detection section after the half rate section is ended and the full rate section is entered. As another example, the pulse extraction circuit 241 may select and output the pulse of the reception data clock RWCK, generated first in the full rate section as the minimum pulse PUL_MIN.

The up/down detection circuit 243 may be connected to the pulse extraction circuit 241 to receive the minimum pulse PUL_MIN from the pulse extraction circuit 241. The up/down detection circuit 243 may detect the pulse width and the differential swing level of the minimum pulse PUL_MIN, based on a detection clock CLK_D and a reference code R_CD to generate an up adjustment signal UPS and a down adjustment signal DNS.

Figure 9:
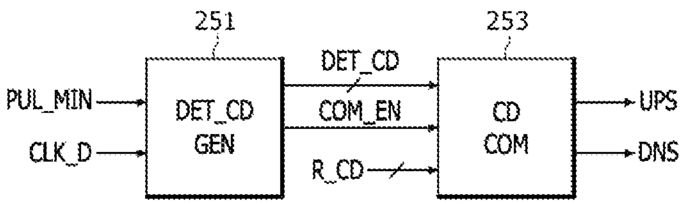
FIG. 9 is a block diagram illustrating a configuration according to an example of an up-down detection circuit included in an adjustment control signal generation circuit according to an embodiment of the present disclosure.

FIG. 9 is a block diagram illustrating a configuration of an up/down detection circuit 243A according to an example of the up/down detection circuit 243 of FIG. 8. As shown in FIG. 9, the up/down detection circuit 243A may include a detection code generation circuit (DET_CD GEN) 251 and a code comparison circuit (CD COM) 253.

The detection code generation circuit 251 may generate a detection code DET_CD and a comparison enable signal COM_EN, based on the minimum pulse PUL_MIN and the detection clock CLK_D. The detection code generation circuit 251 may count the detection clock CLK_D during the minimum pulse PUL_MIN has a positive voltage level to generate the detection code DET_CD. The detection code DET_CD may be set to have a code value corresponding to the pulse width of the minimum pulse PUL_MIN. As an example, The detection code generation circuit 251 may latch the minimum pulse PUL_MIN in synchronization with a rising edge of the detection clock CLK_D, and when the latched value is positive, the code value of the detection code DET_CD may be set to increase by '1'. The detection code generation circuit 251 may generate the comparison enable signal COM_EN at a point in time when the minimum pulse PUL_MIN changes from a positive voltage level to a negative voltage level.

The code comparison circuit 253 may be connected to the detection code generation circuit 251 to receive the detection code DET_D and the comparison enable signal COM_EN from the detection code generation circuit 251. The code comparison circuit 253 may generate the up adjustment signal UPS and the down adjustment signal DNS, based on the comparison enable signal COM_EN, the detection code DET_CD, and the reference code R_CD. The code comparison circuit 253 may compare the detection code DET_CD and the reference code R_CD to generate the up adjustment signal UPS and the down adjustment signal DNS when the comparison enable signal COM_EN is generated. The reference code R_CD may correspond to a reference pulse width of the reception data clock RWCK in the full rate section. A reference pulse width of the reception data clock RWCK may mean the pulse width of the reception data clock RWCK when there is no attenuation due to inter-signal interference. The code comparison circuit 253 may activate the up adjustment signal UPS when the code value of the detection code DET_CD is smaller than the code value of the reference code T_CD. The code comparison circuit 253 may activate the down adjustment signal DNS when the code value of the detection code DET_CD is greater than the code value of the reference code T_CD.

Figure 10:
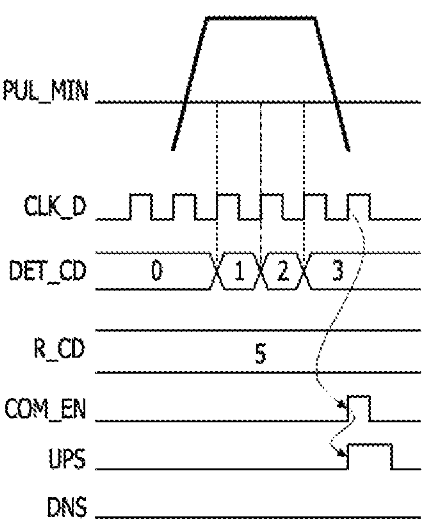
FIGS. 10 and 11 are timing diagrams illustrating operations of an adjustment control signal generation circuit.
Figure 11:
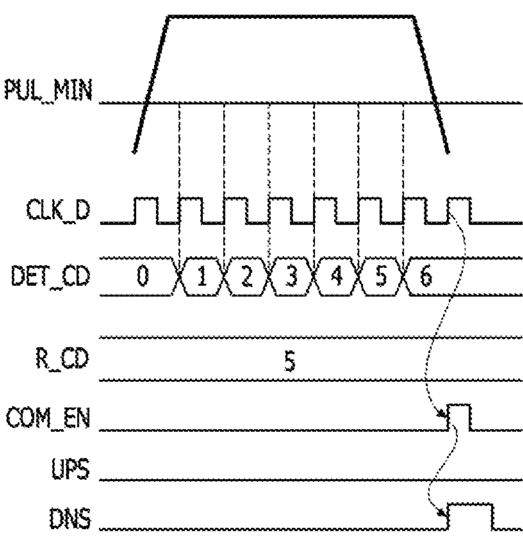

FIGS. 10 and 11 are timing diagrams illustrating operations of the adjustment control signal generation circuit 235A of FIG. 8.

As shown in FIG. 10, the detection code DET_CD may be counted in synchronization with a rising edge of the detection clock CLK_D, which is generated three times during the minimum pulse PUL_MIN has a positive voltage level, and the code value of the detection code DET_CD may be set to 3. When the minimum pulse PUL_MIN transitions from a positive voltage level to a negative voltage level and the comparison enable signal COM_EN is generated, whether the up adjustment signal UPS and the down adjustment signal DNS are activated may be adjusted, based on the comparison result of the detection code DET_CD and the reference code R_CD. Because the code value of the detection code DET_CD is set to be smaller than the code value of the reference code R_CD, the up adjustment signal UPS may be activated.

As shown in FIG. 11, the detection code DET_CD may be counted in synchronization with the rising edge of the detection clock CLK_D, which is generated six times during the period in which the minimum pulse PUL_MIN has a positive voltage level, and the code value of the detection code DET_CD may be set to 6. When the minimum pulse PUL_MIN transitions from a positive voltage level to a negative voltage level and the comparison enable signal COM_EN is generated, whether the up adjustment signal UPS and the down adjustment signal DNS are activated may be adjusted, based on the comparison result of the detection code DET_CD and the reference code R_CD. Because the code value of the sense code DET_CD is set to be greater than the code value of the reference code R_CD, the down adjustment signal UPS may be activated.

The semiconductor system 1 described above with reference to FIG. 1 and the semiconductor system 2 described above with reference to FIG. 7 may be applied to electronic systems including memory systems, graphic systems, computing systems, and mobile systems. For example, referring to FIG. 12, an electronic system 1000 according to an embodiment of the present disclosure may include a data storage unit 1001, a memory controller 1002, a buffer memory device 1003, and an input and output interface 1004.

The data storage unit 1001 may store data (not shown) applied from the memory controller 1002 according to a control signal from the memory controller 1002, may read the stored data (not shown), and may output the data to the memory controller 1002. Meanwhile, the data storage unit 1001 may include a non-volatile memory device capable of continuously storing data without loss even when power is cut off. The non-volatile memory device may be implemented with as a flash memory (NOR flash memory, NAND flash memory) device, a phase change random access memory (PRAM) device, a resistive random access memory (RRAM) device, a spin transfer torque random access memory (STTRAM) device, or a magnetic random access memory (MRAM) device.

Figure 12:
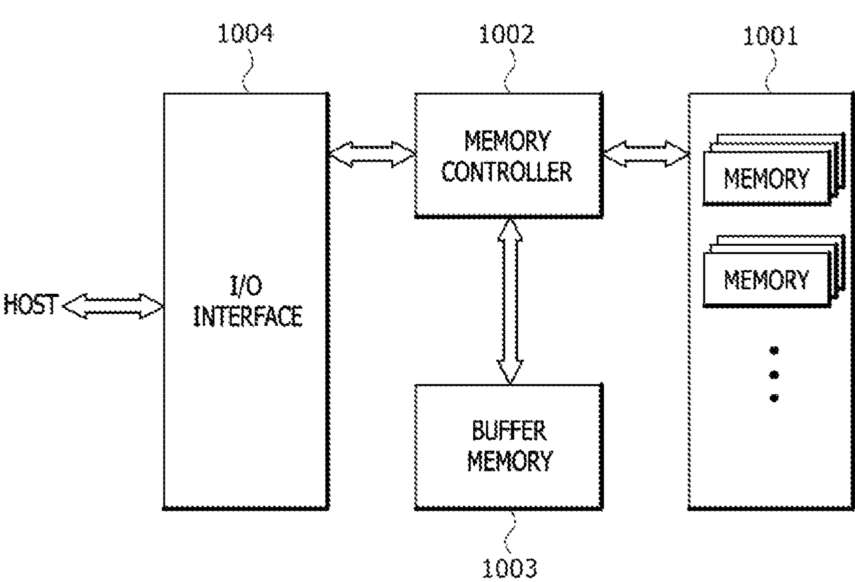
FIG. 12 is a block diagram illustrating a configuration of an electronic system according to an embodiment of the present disclosure.

The memory controller 1002 may decode a command applied from an external device (host device) through the input and output interface 1004, and may control data input and output for the data storage unit 1001 and the buffer memory device 1003 according to a decoding result. In FIG. 12, the memory controller 1002 is shown as one block, but a controller for controlling the data storage unit 1001 and a controller for controlling the buffer memory device 1003, which is a volatile memory device, may be embodied as separate and independent from each other. The memory controller 1002 may include the controller 11 described above with reference to FIG. 1 as well as the controller 21 described above with reference to FIG. 7.

The buffer memory device 1003 may temporarily store data to be processed by the memory controller 1002, that is, data (not shown) input and output to the data storage unit 1001. The buffer memory device 1003 may store data (not shown) applied from the memory controller 1002 according to a control signal. The buffer memory device 1003 may include the semiconductor device 13 described above with reference to FIG. 1 and the semiconductor device 23 described above with reference to FIG. 7. The buffer memory device 1003 may read out the stored data and output the data to the memory controller 1002. The buffer memory device 1003 may include volatile memory devices such as a dynamic random access memory (DRAM) device, a mobile DRAM device, and a static random access memory (SRAM) device.

The input and output interface 1004 may provide a physical connection between the memory controller 1002 and an external device (host) to allow the memory controller 1002 to receive a control signal for data input and output from the external device and to exchange data with the external device. The input and output interface 1004 may include one of a variety of interface protocols such as USB, MMC, PCI-E, SAS, SATA, PATA, SCSI, ESDI, IDE, and the like.

The electronic system 1000 may be used as an auxiliary storage device of a host device or an external storage device. The electronic system 1000 may include a solid state disk (SSD), a universal serial bus (USB) memory device, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF), and the like.

Figure 13:
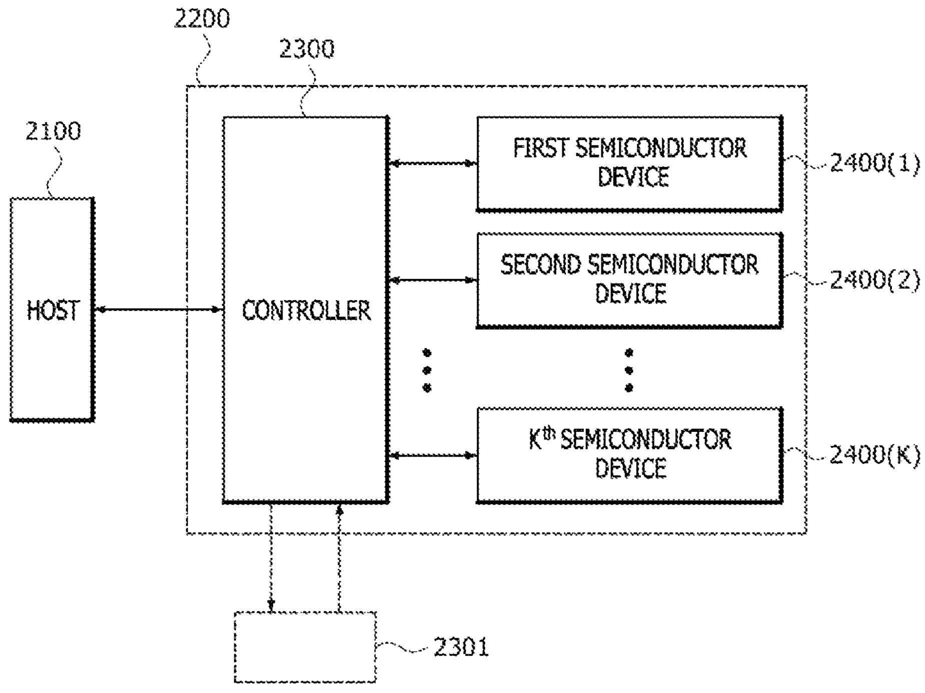
FIG. 13 is a block diagram illustrating a configuration of an electronic system according to another embodiment of the present disclosure.

FIG. 13 is a block diagram illustrating a configuration of an electronic system 2000 according to another embodiment of the present disclosure. As shown in FIG. 13, the electronic system 2000 may include a host 2100 and a semiconductor system 2200.

The host 2100 and the semiconductor system 2200 may transmit signals to each other using interface protocols. The interface protocols used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1:K). The controller 2300 may apply a voltage code V_CD, a code input control signal CICNT, and a fuse selection address FS_ADD to each of the semiconductor devices 2400(1:K). Each of the semiconductor devices 2400(1:K) may receive the voltage code V_CD, the code input control signal CICNT, and the fuse selection address FS_ADD to adjust a voltage level of an internal voltage VINT.

The controller 2300 may include the controller 11 described above with reference to FIG. 1 and the controller 21 described above with reference to FIG. 7. Those of ordinary skill in the art should recognize that in alternate embodiments, the functionality of the half-rate section required by the LPDDR5 (Low Power DDR5) specification can be provided instead by a functionally-equivalent half-rate section located outside of, or peripheral to, a controller not having the half-rate section required by the LPDDR5 (Low Power DDR5) specification. In FIG. 13, a half-rate section 2301 that is external to and not part of the controller 2300, is depicted with broken lines. Clock signals are depicted flowing into and returning from the external half-rate section 2301. Each of the semiconductor devices 2400 (1:K) may include the semiconductor device 13 described above with reference to FIG. 1 and the semiconductor device 23 described above with reference to FIG. 7. Each of the semiconductor devices 2400(1:K) may be implemented with one of a dynamic random access memory (DRAM), a phase change random access memory (PRAM), a resistive random access memory (RRAM), a magnetic random access memory (MRAM), and ferroelectric random access memory (FRAM).

Those skilled in the art will appreciate that various modifications, additions, and substitutions are possible, without departing from the scope and spirit of the present disclosure. The embodiments disclosed in the present specification should therefore be considered as illustrative examples. The true scope of the concepts disclosed herein are defined by the accompanying claims.

What is claimed is:

1. A semiconductor system comprising:

a controller configured to: adjust a duty ratio of a data clock according to a system rate; generate a transmission data clock; and transmit the transmission data clock through a channel; and a semiconductor device configured to: receive the transmission data clock through the channel as a reception data clock; and generate an internal data clock for a data input and output operation, based on the reception data clock, wherein the controller comprises a half rate section, which adjusts the duty ratio of the data clock according to the system rate, and wherein the data clock is set to have a frequency corresponding to a rate lower than of a data input and output rate in the half rate section, and is set to have a frequency corresponding to the data input and output rate in a full rate section.

2. The semiconductor system of claim 1, wherein the data clock is set to have a frequency corresponding to ½ of a data input and output rate in the half rate section.

3. The semiconductor system of claim 2, wherein the data input and output rate is set to a rate at which the data input and output operation is performed, and is set to 'N' times the system rate, the 'N' being set to a multiple of 2.

4. The semiconductor system of claim 2, wherein the full rate section is entered after the half rate section is ended.

5. The semiconductor system of claim 1, wherein the controller includes a duty adjustment circuit configured to generate the transmission data clock, based on a section setting signal, system rate information, and the data clock.

6. The semiconductor system of claim 5, wherein the section setting signal is activated when the half rate section is set.

7. The semiconductor system of claim 5, wherein the system rate information includes information about the system rate.

8. The semiconductor system of claim 5, wherein the duty adjustment circuit is configured to:

generate the transmission data clock by adjusting the duty ratio of the data clock by a first duty ratio change when the system rate is set to a first system rate in the half rate section, and generate the transmission data clock by adjusting the duty ratio of the data clock by a second duty ratio change when the system rate is set to a second system rate in the half rate section.

9. The semiconductor system of claim 1, wherein the semiconductor device includes:

a data clock buffer configured to buffer the reception data clock to generate the internal data clock; and an input and output control circuit configured to perform a data input and output operation, based on the internal data clock.

10. A semiconductor system comprising:

a controller configured to: adjust a duty ratio of a data clock according to a duty adjustment signal in a half rate section; generate a transmission data clock; and transmit the transmission data clock through a channel; and a semiconductor device configured to: receive the transmission data clock through the channel as a reception data clock; generate an internal data clock for a data input and output operation, based on the reception data clock; and generate the duty adjustment signal, based on the reception data clock, wherein the data clock is set to have a frequency corresponding to a rate lower than of a data input and output rate in the half rate section, and is set to have a frequency corresponding to the data input and output rate in a full rate section.

11. The semiconductor system of claim 10, wherein the data clock is set to have a frequency corresponding to ½ of a data input and output rate in the half rate section, and wherein the full rate section is entered after the half rate section is ended.

12. The semiconductor system of claim 11, wherein the data input and output rate is set to a rate at which the data input and output operation is performed, and is set to 'N' times a system rate, the 'N' being set to a multiple of 2.

13. The semiconductor system of claim 10, wherein the duty adjustment signal includes an up adjustment signal and a down adjustment signal, and wherein the controller includes a duty adjustment circuit configured to generate the transmission data clock, based on a section setting signal, the up adjustment signal, the down adjustment signal, and the data clock.

14. The semiconductor system of claim 13, wherein the duty adjustment circuit receives the up adjustment signal and the down adjustment signal through the channel.

15. The semiconductor system of claim 13, wherein the duty adjustment circuit is configured to:

generate the transmission data clock by increasing a duty ratio of the data clock when the up adjustment signal is activated in the half rate section, and generate the transmission data clock by decreasing the duty ratio of the data clock when the down adjustment signal is activated in the half rate section.

16. The semiconductor system of claim 10, wherein the duty adjustment signal includes an up adjustment signal and a down adjustment signal, and wherein the semiconductor device includes an adjustment control signal generation circuit configured to generate the up adjustment signal and the down adjustment signal by detecting a degree of attenuation of the reception data clock in a full rate section.

17. The semiconductor system of claim 16, wherein the adjustment control signal generation circuit includes:

a pulse extraction circuit configured to extract a pulse having a minimum pulse width and a minimum differential swing level among pulses included in the reception data clock as a minimum pulse; and an up/down detection circuit configured to generate the up adjustment signal and the down adjustment signal by detecting the pulse width and differential swing level of the minimum pulse, based on a detection clock and a reference code.

18. The semiconductor system of claim 17, wherein the up/down detection circuit includes:

a detection code generation circuit configured to generate a sense code by counting a sense clock, based on the minimum pulse; and a code comparison circuit configured to generate the up adjustment signal and the down adjustment signal by comparing the sense code with the reference code.

19. The semiconductor system of claim 18, wherein the detection code generation circuit generates the detection code that is set to have a code value corresponding to a pulse width of the minimum pulse.

20. The semiconductor system of claim 18, wherein the code comparison circuit is configured to:

activate the up adjustment signal when the sense code is smaller than the reference code, and activate the down adjustment signal when the sense code is greater than the reference code.

21. A semiconductor system comprising:

a controller configured to generate a data clock for controlling a data input and output operation to output the data clock through a channel, wherein the controller is additionally configured to:

generate the data clock having a first frequency and a first duty ratio for a first section, and generate the data clock having a second frequency and a second duty ratio for a second section after the first section, wherein the first frequency and the second frequency are set to be different, and the first duty ratio and the second duty ratio are set to be different.

22. The semiconductor system of claim 21, wherein the second frequency corresponds to a data input and output rate.

23. The semiconductor system of claim 22, wherein the first frequency corresponds to ½ of the second frequency.

24. The semiconductor system of claim 21, wherein the first duty ratio is set to (50+α) %, and the α is set to a positive or negative number.

25. The semiconductor system of claim 24, wherein the second duty ratio is set to 50%.

26. The semiconductor system of claim 21, wherein the controller sets the first section and the second section, based on a section setting signal.

27. The semiconductor system of claim 21, wherein the controller adjusts the first duty ratio according to a system rate.

* * * * *